United States Patent [19]

Ries

[11] Patent Number: 5,347,252
[45] Date of Patent: Sep. 13, 1994

[54] MAGNETIC DEVICE HAVING A YOKE MEMBER FOR GENERATING A MAGNETIC STRAY FIELD

[75] Inventor: Günther Ries, Erlangen, Fed. Rep. of Germany

[73] Assignee: Siemens Aktiengesellschaft, Munich, Fed. Rep. of Germany

[21] Appl. No.: 923,274

[22] Filed: Jul. 31, 1992

[30] Foreign Application Priority Data

Aug. 1, 1991 [EP] European Pat. Off. ........ 91112957.5

[51] Int. Cl.$^5$ ............................................. H01F 5/00
[52] U.S. Cl. .................... 335/299; 324/318; 335/301
[58] Field of Search ............... 335/216, 298, 299, 301; 324/318

[56] References Cited

U.S. PATENT DOCUMENTS

| | | | |
|---|---|---|---|
| 4,724,412 | 2/1988 | Kalafala . | |
| 4,937,545 | 6/1990 | Chaillout et al. | 335/298 |
| 5,012,217 | 4/1991 | Palkovich et al. | 335/301 |
| 5,136,273 | 8/1992 | Ohta | 335/301 |

FOREIGN PATENT DOCUMENTS

| | | |
|---|---|---|
| 0424808 | 5/1991 | European Pat. Off. . |
| 3719306 | 12/1988 | Fed. Rep. of Germany . |
| 3737133 | 5/1989 | Fed. Rep. of Germany . |
| 2562785 | 10/1985 | France . |
| WO84/00611 | 2/1984 | PCT Int'l Appl. . |
| 2232771 | 12/1990 | United Kingdom . |

OTHER PUBLICATIONS

Japanese Journal of Applied Physics, vol. 15, No. 9, 1 Sep. 1976, Tokyo, Japan, pp. 1695–1702; K. Tsuno et al.: *Effect of Radius of Yoke Curvature on Leakage Flux outside the Yoke in Permanent Magnet Assemblies.*

Review of Scientific Instruments, vol. 57, No. 3, 1 Mar. 1986, New York, US, pp. 393–403; A. Bielecki et al.: *Zero-Field NMR and NQR Spectrometer.*

Primary Examiner—Lincoln Donovan
Attorney, Agent, or Firm—Kenyon & Kenyon

[57] ABSTRACT

A magnetic device (2) containing a soft magnetic yoke member (3) in its magnetic circuit. The yoke member carries a magnetic flux ($\Phi$) produced by a magnetic-field-generating device (7,8) and generates a magnetic stray field ($H_s$). To reduce this stray field, the present invention surrounds a section (3c) of the yoke member (3) by a compensating-field winding (13), which is electrically excited so that, in addition to the flux ($\Phi$) produced by the device (7,8) in the yoke member (3), a supplemental flux ($\Phi'$) of such magnitude is created that the magnetic dipole moment of the yoke member (3) that produces the stray field ($H_s$) is at least partially compensated for.

11 Claims, 2 Drawing Sheets

MAGNETIC DEVICE HAVING A YOKE MEMBER FOR GENERATING A MAGNETIC STRAY FIELD

BACKGROUND OF THE INVENTION

The present invention relates to a device having a magnetic circuit which interacts with a yoke member made of soft magnetic material. The yoke member carries a magnetic flux produced by a magnetic-field-generating device and generates a magnetic stray field. This type of magnetic device is described in the German Published Patent Application 37 37 133.

Homogeneous field magnets which generate magnetic basic fields in nuclear spin tomography systems (nuclear magnetic resonance tomography, imaging or spectroscopy) are known. The magnetic field of this type of basic field magnet must be sufficiently homogeneous in an imaging or examination area (useful volume) and must generate a predetermined magnetic induction $B_o$ in that area. For this purpose, normal-conducting coils or permanent magnets are provided as a magnetic-field-generating device. They are mounted, for example, on a C-shaped yoke :member of soft magnetic material. This yoke member carries the generated magnetic flux outside of the useful volume situated between the pole faces of opposite pole shoes.

The magnetic circuit can in fact be substantially closed with this type of yoke member. However, such a yoke member creates a magnetic stray field that is relatively far-reaching. Such stray fields are undesirable, particularly in nuclear spin tomography.

Therefore, the object of the present invention is to provide a magnetic device having the characteristics mentioned at the outset with a reduced stray field produced by the yoke member.

SUMMARY OF THE INVENTION

This objective is solved according to the present invention by providing a compensating-field winding around a section of the yoke member. This compensating-field winding is electrically excited so that, in addition to the magnetic flux produced by the device in the yoke member, a supplemental magnetic flux is also created. The magnitude of the supplemental magnetic flux is determined such that the magnetic dipole moment of the yoke member that produces the stray field is at least partially compensated for.

The present invention first realized that the soft magnetic material of the yoke member forms a magnetic resistance to the magnetic flux due to the finite value of the relative permeability $\mu_r$ in the order of magnitude of, for example, 1000. This magnetic resistance manifests itself in the form of a magnetic dipole moment of the yoke member and is to be regarded as the principal source of the stray field. The present invention compensates for the magnetic moment of the yoke member, at least in part, by an opposite moment of a current-carrying coil. The advantages associated with the present invention are evident. In particular, the range of the yoke member's stray field is reduced by the opposing moment of the current carrying coil. In this manner, the space surrounding the magnetic device does not need to be restricted unnecessarily to uncontrolled access, particularly in areas that border on a corresponding nuclear spin tomography installation.

Advantageous refinements of the magnetic device according to the invention proceed from the dependent claims.

DETAILED DESCRIPTION

Figure 1:
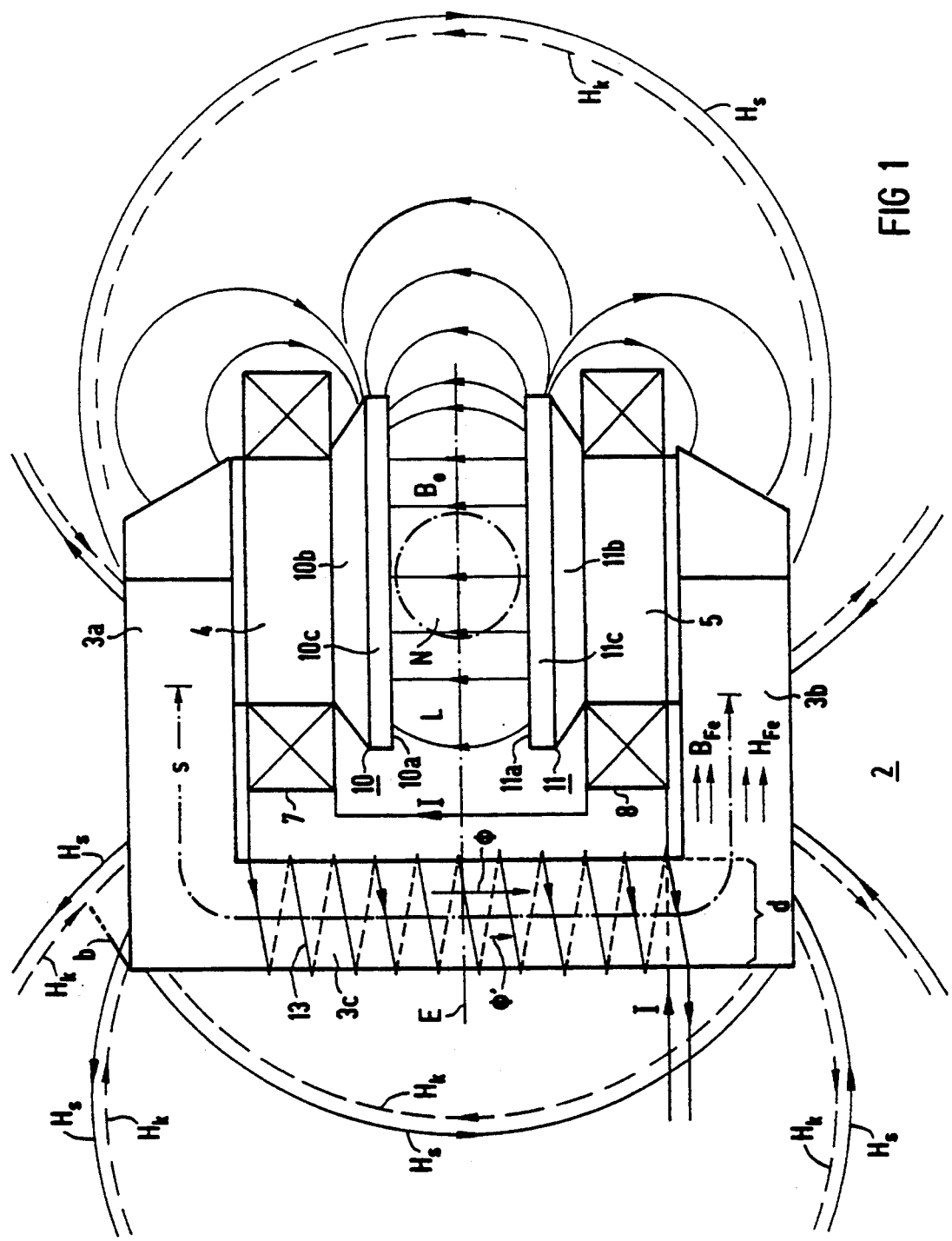
FIG. 1 schematically depicts a specific embodiment of a magnetic device including magnetic flux lines according to the present invention.

The magnetic device according to the present invention begins with typical specific embodiments having a soft magnetic yoke member. These can be, in particular, basic field magnets in a nuclear spin tomography installation. For the subsequent illustrated embodiment, an appropriate magnetic device is selected, which is constructed in a well-known way (compare the mentioned German Published Patent Application 37 37 133) as a pole shoe magnet.

The magnetic device, denoted generally by 2, features a single-limb yoke member 3a, 3b, 3c made of a soft magnetic material, such as iron, having a relative permeability $\mu_r$ of approximately 1000. The magnetic device is often described as a C-magnet due to the shape of its yoke member 3. The two opposite, unattached limb ends 3a and 3b of the yoke member 3 lead, in each case, into an at least roughly cylindrical core of magnetic material 4 and 5, respectively. Each of these cores 4 and 5 is surrounded by its own excitation coil 7 and 8, respectively. At the sides turned away from the limb ends 3a or 3b, the two cores 4 and 5 become pole shoes 10 and 11 each having a pole face 10a and 11a, respectively. Thus, the entire magnetic device is constructed to be at least substantially symmetrical relative to a plane of symmetry E.

Each of the pole shoes 10 and 11 includes a base part 10b and 11b, respectively, which faces the core 4 and 5, respectively, as well as of an optionally contoured pole plate 10c and 11c, respectively. An air gap L having a useful volume N is situated between the pole faces 10a and 10b of these pole plates. A magnetic field, which is produced by the two excitation coils 7 and 8 and which is sufficiently homogeneous for nuclear spin tomography, may prevail in this useful volume N. Lines with arrows indicate a magnetic induction $B_o$ which is created by the magnetic field producing coils 7 and 8 in the useful volume. The magnetic induction $B_o$ is restricted, in particular, by the saturation magnetization of the yoke :material and lies, for example, under 0.5 T.

Furthermore, FIG. 1 schematically depicts magnetic stray fields caused by the air gap L, the excitation coils 7 and 8, as well as the yoke member 3 with solid lines having arrows:

The air gap L and the coils 7 and 8 form equally strong magnetic dipoles, which are connected back-to-back. The magnetic far fields of these coils parts partially cancel each other out. Only higher multipole fields remain. They fall off quickly with $r^{-5}$, $r^{-7}$, etc., wherein r is the distance from the magnetic-field-producing center of the magnetic device.

The magnetic reflux $\Phi$ is carried in the yoke member 3. However, the iron (Fe) (the material for the yoke:-member) produces a magnetic resistance based on the finite value of the permeability $\mu_r$. A few percent of the ampere-turns produced by the coils 7 and 8 are used up to overcome this magnetic resistance. A flux density $B_{Fe}$ should be maintained in the iron. In view of the magnetic resistance, a magnetic field strength $H_{Fe}$ is to be acquired by the excitation coils 7 and 8, whereby a small portion of the magnetic field lines of is pushed as a stray field out of the iron into the and surrounding air. Due to the continuity of the tangential field strength, the field strength $H_{Fe}$ must also prevail in the air beyond the air/Fe boundary surface. As a result, a difference $\int H_{Fe}^* ds$ in the magnetic potential between the upper and lower side of the yoke member along an integration path s is present. This integration path s runs in the yoke member 3 in the flux carrying direction and represents the path of a magnetic circuit. This magnetic circuit is closed by the magnetic field lines through the yoke member, outside of the areas taken up by the excitation coils 7 and 8, the pole shoes 10 and 11, as well as the air gap L. This difference in magnetic potential leads to a magnetic dipole. Its far field $H_s$ is proportional to the integral $\int H_{FE}^* ds/r^3$ and, therefore, falls off with $r^3$. This far field $H_s$ makes up the principal component of the magnetic stray field of the yoke member 3.

To at least partially compensate for this far field $H_s$, the present invention compensates for the magnetic dipole moment of the yoke member 3 accordingly by an opposite moment produced by a current-carrying compensating-field winding 13. This compensating-field winding 13 surrounds the yoke member at any point along the integration path s, for example in the area of the yoke section part 3c running perpendicular to the limb ends 3a and 3b. This winding is effectively connected in series to the excitation coils 7 and 8 of the magnetic device. The field of the compensating-field winding 13 compensates for the stray field $H_s$. The lines of this compensating field are illustrated in FIG. 1 by dotted lines denoted by $H_k$.

To determine the proper dimensions of the compensating-field winding 13, an equivalent interpretation equivalent to the consideration of the magnetic moments is employed, namely this winding can be looked upon more or less as a surface current density J on the iron surface of the yoke member 3. There, a sudden change of the density J in the tangential field strength $H_t$ is caused, for which $$H_t = H_{Fe} - J = 0$$

is called for in the space outside of the iron and the winding.

Viewed from the outside, the iron appears to be a material with an infinitely high permeability $\mu_r$. With this rating rule, the sought after ampere-turn number $n_k^* I$ of the compensating-field winding 13, whereby $n_k$ is the number of turns of the winding 13 and I is the current flowing through this winding can be specified by the following:

$$\int J^* ds = n_k^* I = \int H_{Fe}^* ds \approx <H_{Fe}>^* s.$$

The average value $<H_{Fe}>$ can be calculated with the aid of a numerical simulation or, alternatively, may also be measured directly at the outer yoke surface with a gaussmeter. The segment s illustrated by a dot-dash line comprises the integration path in the iron of the yoke member 3 outside of the coil area and the useful air gap, that is the perpendicular yoke section part 3c, as well as parts of the tipper and lower yoke limb 3a or 3b. For instance, if one specifies $s \approx 3$ m and $H_{Fe} \approx 11$ A/cm for a C-magnet used in nuclear spin tomography, then $$n_k = \frac{<H_{Fe}>^* s}{I} = \frac{11 \ A/cm * 300 \ cm}{300 A} = 11 \text{ turns}$$

results for the compensating-field winding 13 at an excitation current of 300 A, as is required, for example, to produce a magnetic induction $B_o$ of 0.3 T.

No particular accuracy requirements are placed on this winding 13. For instance, it can be wound solely around the perpendicular yoke section part 3c. Forgoing a local field compensation, that is $H_{Fe} \neq J$, only results in higher multicomponents, which fall off spatially fast in the stray field.

The turns of the compensation winding 13 surround the magnetic circuit in the same direction (with the same direction of winding) as that of the excitation coils 7 and 8. In the final analysis then, the measures according to the present invention only signify taking the ampere-turns consumed by the magnetic resistance of the iron away from the excitation coils and distributing them along the yoke member 3. The additional magnetic flux, which is required for this and which is produced in the yoke member 3 by the compensating-field winding 13, is denoted in the Figure by $\Phi'$. It is directed in the same direction as that of the flux $\Phi$ produced by the excitation coils 7 and 8. Thus, no additional requirement for excitation power arises. Therefore, the value $n_k^* I$ depends only on the degree of saturation of the iron, and not, on the basic field strength of the magnetic device.

By applying a compensating-field winding 13, according to the present invention, reducing the flux-carrying cross-section of the yoke member 3 and thus, advantageously, the iron mass, without considerably enlarging the stray field is possible by increasing the ampere-turns of the compensating-field winding accordingly. The Table in the following shows a few examples of a 0.3 T magnetic device according to the present invention and in accordance with FIG. 1, with a yoke member 3 of iron having the company description St 37 and a carbon content of less than 0.21%. The variables b and d refer to the cross sectional area of the yoke member 3 in the vicinity of its perpendicular yoke section 3c.

TABLE

| b*d (m²) | 1.1*0.3 | 1.1*0.25 | 1.1*0.23 | 1*0.23 |
|---|---|---|---|---|
| iron mass (to) | 11.9 | 10.1 | 9.4 | 8.8 |
| $B_{Fe}$ (Tesla) | 1.25 | 1.5 | 1.63 | 1.8 |
| $H_{Fe}$ (A/cm) | 11 | 25 | 50 | 100 |
| $n_k^* I$ (Awdg) | 3300 | 7500 | 15000 | 30000 |
| $n_k$ at I = 300 A | 11 | 25 | 50 | 100 |

Figure 2:
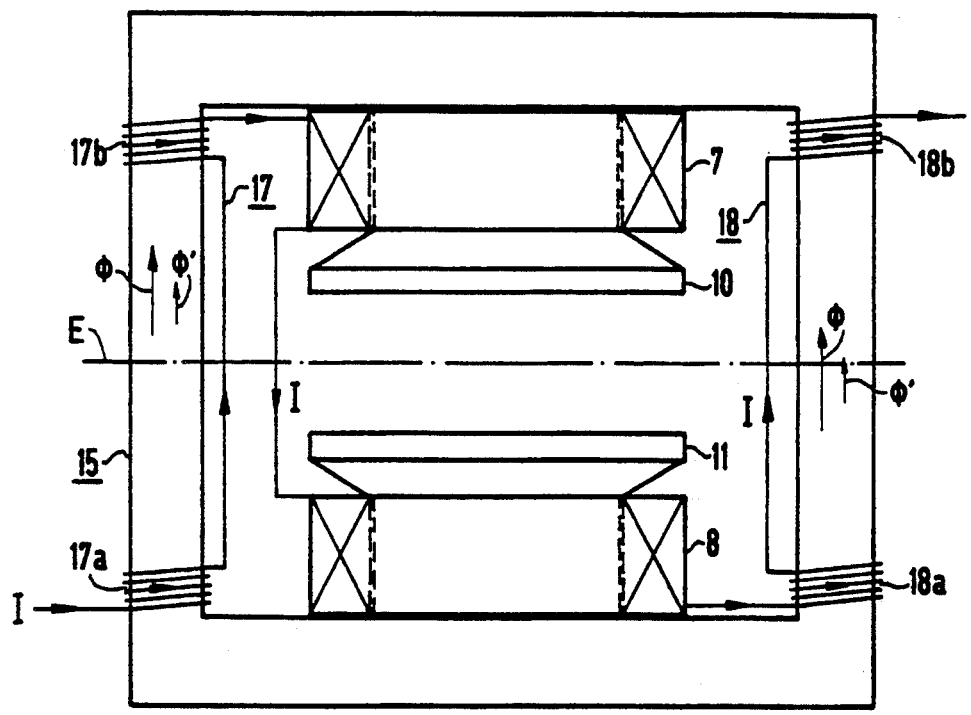
FIG. 2 depicts an alternate embodiment of the present invention.

In accordance with the exemplified embodiment of FIG. 1, initially, the yoke member 3 of the magnetic device 2 is assumed to have a single flux-carrying yoke section, which runs perpendicular to and connects an upper and a lower limb part to accommodate the pole pieces and excitation coils. However, the present invention is not limited to such specific embodiments of yoke members. Rather, yoke members having at least two flux-carrying yoke sections can also be provided. In this case, a compensating-field winding having the same number of ampere-turns must be installed around each yoke section. A corresponding exemplified embodiment of a magnetic device having two yoke sections, which is also described as an H-magnet or as a "window-frame magnet" proceeds from the schematic cross-section of FIG. 2. This magnetic device, generally denoted by 15, differs substantially from the magnetic device 2 of FIG. 1 by the shape of its magnetic-flux-carrying yoke member 16. While the yoke member 3 of the magnetic device 2 according to FIG. 1 is C-shaped, the air interspace of the magnetic device 15 has an H-shape. The advantage of a C-magnet can be seen in the easy access to the useful volume, from the left side. On the other hand, an H-magnet has a symmetrical design, so that deformations of its yoke member, for example due to magnetic forces or as the result of thermal dilitation, have less of an effect on the parallelism of pole faces and thus on the homogeneity. Moreover, its overall height is comparatively lower.

Due to the symmetrical design of the H-Magnet 15, two partial windings 17 or 18 of a compensating-field winding are placed around the two perpendicular yoke sections 16a and 16b of the yoke member 16. Each partial winding can be subdivided thereby into two or more compact winding packets 17a, 17b or 18a, 18b per yoke section. In this specific embodiment of the magnetic device 15, the partial windings 17 and 18 are connected in series to the excitation coils 7 and 8. The directions of current flow of the excitation current I flowing through these partial windings and the excitation coils are illustrated by arrows. The winding direction and thus the current-flow directions through the partial windings 17 and 18 must be selected, on the other hand, so that in the particular yoke section 16a or 16b, these partial windings produce an additional magnetic flux $\Phi'$, which points in the same direction as the magnetic flux $\Phi$ produced by the excitation coils 7 and 8 in the yoke section in question.

The present invention is not limited to the application of the magnetic device in a nuclear spin tomography installation. Rather, wherever reducing an undesirable magnetic stray field produced by a yoke member is necessary, the present invention may be used. Such stray fields that require reduction can also be produced, for example, by transformer cores or by the iron yoke of a beam-carrying magnet in an accelerator.

What is claimed is:

1. A device comprising:
   a) a magnetic circuit which includes a yoke member, said yoke member being made of soft magnetic material having a finite relative permeability;
   b) a magnetic field generating device generating a magnetic flux in said yoke member and also generating a magnetic stray field due to a magnetic dipole moment in said yoke member, which in turn is due to the relative permeability of said yoke member; and
   c) a compensating-field winding, said compensating-field winding, surrounding a section of said yoke member, being electrically excited so that, in addition to the magnetic flux produced by the magnetic field generating device in the yoke member, a supplemental magnetic flux of a magnitude is created such that the magnetic dipole moment of the yoke member that produces the stray field is at least partially compensated for.

2. The device according to claim 1, wherein said compensating-field winding comprises a plurality of partial windings.

3. The device according to claim 2, wherein at least one of said plurality of partial windings includes at least two winding packets.

4. The device according to claim 1 wherein said magnetic field generating device includes at least one permanent magnet.

5. The device according to claim 1 wherein said magnetic field generating device include at least one electrical excitation coil.

6. The device according to claim 5, wherein said compensating-field winding is connected in series to an least one excitation coil.

7. The device according to claim 1 wherein said yoke member has a C-shape.

8. The device according to claim 1 wherein said yoke member has a H-shape.

9. A homogeneous field magnet used in nuclear spin tomography comprising:
   a) a magnetic circuit which includes a yoke member, said yoke member being made of soft magnetic material having a finite relative permeability;
   b) a magnetic field generating device generating a magnetic flux in said yoke member and also generating a magnetic stray field due to a magnetic dipole moment in said yoke member, which in turn is due to the relative permeability of said yoke member; and
   c) a compensating-field winding, said compensating-field winding, surrounding a section of said yoke member, being electrically excited so that, in addition to the magnetic flux produced by the magnetic field generating device in the yoke member, a supplemental magnetic flux of a magnitude is created such that the magnetic dipole moment of the yoke member that produces the stray field is at least partially compensated for.

10. The device according to claim 1 wherein said magnetic field generating device includes at least one excitation coil connected in series with said compensating-field winding.

11. In a device having
    a yoke member, defining a void of useful volume, and
    at least one excitation coil, coupled with the yoke member, generating a magnetic flux through a path defined by the yoke member, and generating a required magnetic field, having a magnetic field strength in the useful volume, a method for compensating a stray field due to a dipole moment formed in the yoke member due to a relative permeability of the yoke member, comprising the steps of:
    a) determining the length of the path defined by the yoke member;
    b) determining the required magnetic field strength;
    c) providing a compensating winding around the yoke member, carrying a predetermined current and having a number of turns equal to the product of the required magnetic field strength determined in step (b) with the length of path determined in step (a), divided by the predetermined current.

* * * * *